United States Patent [19]
Anderson, Jr. et al.

[11] 3,967,270
[45] June 29, 1976

[54] ANALOG-TO-DIGITAL CONVERTER

[75] Inventors: Robert L. Anderson, Jr., Pittsburgh; James B. Russell, Glenshaw, both of Pa.

[73] Assignee: Essex International, Inc., Fort Wayne, Ind.

[22] Filed: July 8, 1974

[21] Appl. No.: 486,446

[52] U.S. Cl.................. 340/347 NT; 340/347 AD
[51] Int. Cl.² ...................................... H03K 13/20
[58] Field of Search................ 340/347 NT, 347 AD

[56] References Cited
UNITED STATES PATENTS

| | | | |
|---|---|---|---|
| 3,566,265 | 2/1971 | Reid | 324/99 |
| 3,566,397 | 2/1971 | Walton | 340/347 |
| 3,599,203 | 8/1971 | Conley | 340/347 AD |
| 3,733,600 | 5/1973 | Hellwarth et al. | 340/347 NT |
| 3,737,893 | 6/1973 | Belet et al. | 340/347 NT |
| 3,747,089 | 7/1973 | Sharples | 340/347 NT |

OTHER PUBLICATIONS

Walton, "Triple Ramp A–D Conv. With Reverse Direction Third Ramp," IBM Tech. Disc. Bulletin, vol. 11, No. 4, Sept. 68, pp. 384, 385.

*Primary Examiner*—Charles D. Miller
*Attorney, Agent, or Firm*—Allegretti, Newitt, Witcoff & McAndrews

[57] ABSTRACT

The disclosure describes an improved analog-to-digital converter which enables the use of a reference voltage having the same polarity as the input analog voltage being converted. The converter employs an operational amplifier having a capacitive feedback network, an inverting input, and a non-inverting input. The inverting input is periodically disconnected so that the output of the operational amplifier slews to a new value without substantially changing the voltage across the capacitive feedback network.

6 Claims, 5 Drawing Figures

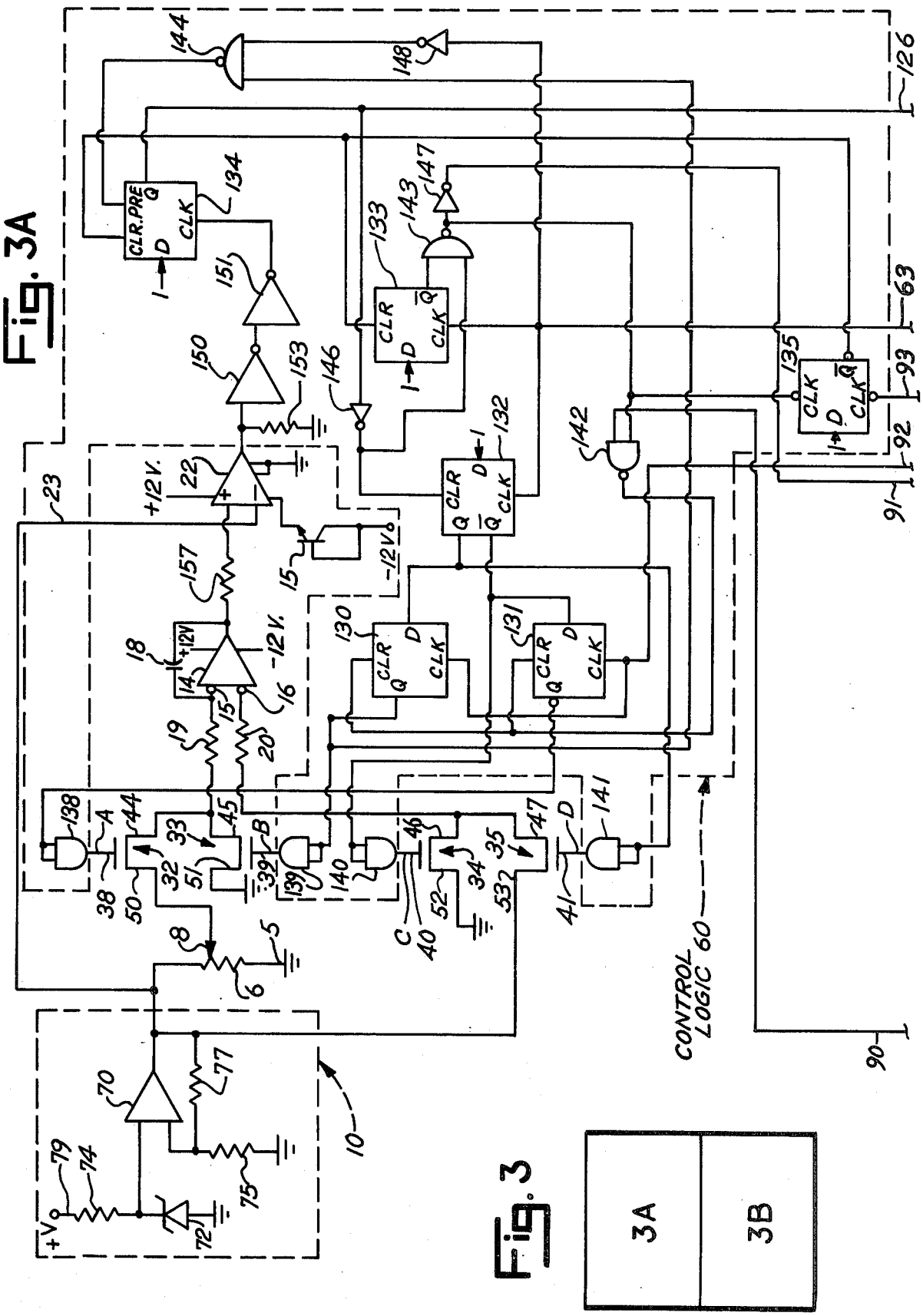

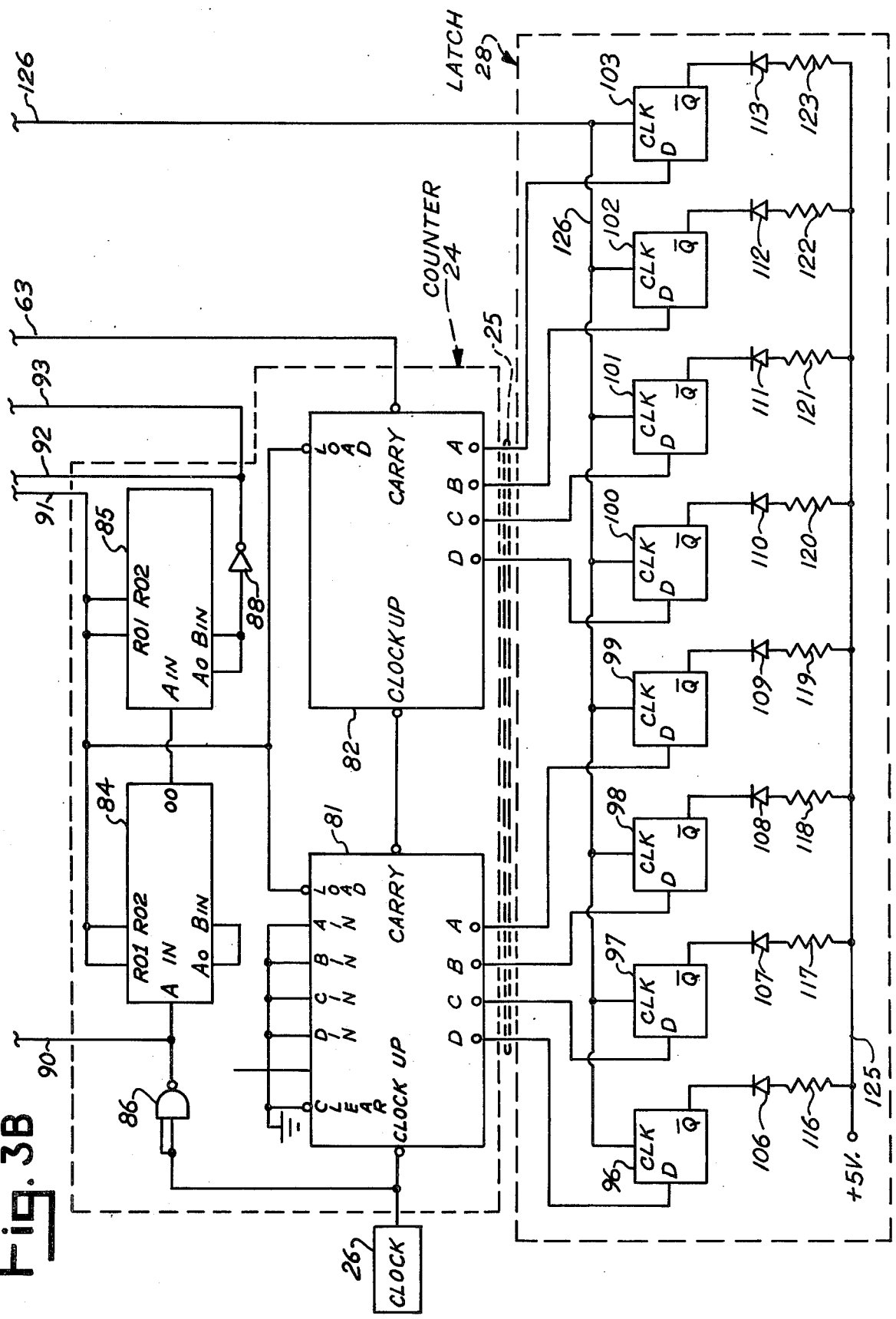

ANALOG-TO-DIGITAL CONVERTER

BACKGROUND AND SUMMARY OF THE INVENTION

This invention relates to analog-to-digital converters, and more specifically relates to such converters which employ integrating circuits.

A variety of integrating circuit-type analog-to-digital converters have been devised in the past. In such a converter, the integrating circuit generally comprises an operational amplifier having a capacitive feedback network. At the beginning of a conversion cycle, the capacitor is discharged and the inverting input of the operational amplifier is connected to the input analog voltage being converted. The integrator causes a linear voltage increase across the capacitor which continues for a predetermined period of time determined by a digital counter. At the end of the predetermined time period, the counter is reset, the inverting input of the amplifier is connected to a precision reference voltage and the capacitor charges in the opposite direction until a comparator detects that ground potential is reached. At this time, an output pulse is generated which stops the counter. The resulting count in the counter is proportional to the analog input voltage.

The difficulty with this form of converter is that the precision reference voltage must have a polarity opposite the polarity of the input analog voltage. This is of particular importance when the input signal is derived as a ratio of the reference voltage. In this case, both polarities of the precision reference voltage must be available, thereby increasing the parts required for the power supply and adding additional error-causing circuitry. In many instances, the only circuitry in a system requiring the use of precision reference voltages of opposite polarities is the analog-to-digital converter. As a result, expensive and potentially unreliable circuitry must be added to the power supply in order to accommodate this single circuit component.

In order to overcome the disadvantages of the prior art, the applicants have discovered an integrating-type analog-to-digital converter which requires only a single polarity for the input analog voltage and the reference voltage. In order to achieve this result, according to a preferred feature of the invention, the applicants have provided an input terminal for receiving the analog DC voltage and a current sink, such as a source of ground potential, having a neutral polarity and a neutral voltage. The applicants also provide a source of a reference voltage which may have a polarity identical to the polarity of the analog voltage. An integrating circuit is provided having an inverting input, a non-inverting input, and an output for producing an output signal. Comparator means produce an indicating signal in response to a predetermined relationship between the output signal and the reference voltage. A digital counter resettable in response to the indicating signal is also provided, and a pulse generator generates clock pulses which may be transmitted to the counter. First and second switch means control the connections between the analog voltage, current sink, and reference voltage. The operation of the switch means and counter is coordinated by a control circuit so that the counter produces a digital number proportional to the magnitude of the analog voltage by using a reference voltage of the same polarity.

According to another feature of the invention, the inverting input of the integrating circuit is periodically disconnected from the analog voltage, reference voltage and current sink so that the output signal can slew to a new value of reversed polarity without reversing the polarity of an input signal.

BRIEF DESCRIPTION OF THE DRAWING

These and other advantages and features of the present invention will hereafter appear in connection with the accompanying drawing in which:

FIGS. 3A and 3B are more detailed electrical schematic drawings showing a preferred form of the present invention; and FIG. 3 is a chart showing the manner in which FIGS. 3A and 3B should be arranged.

DESCRIPTION OF THE PREFERRED EMBODIMENT

Figure 1:
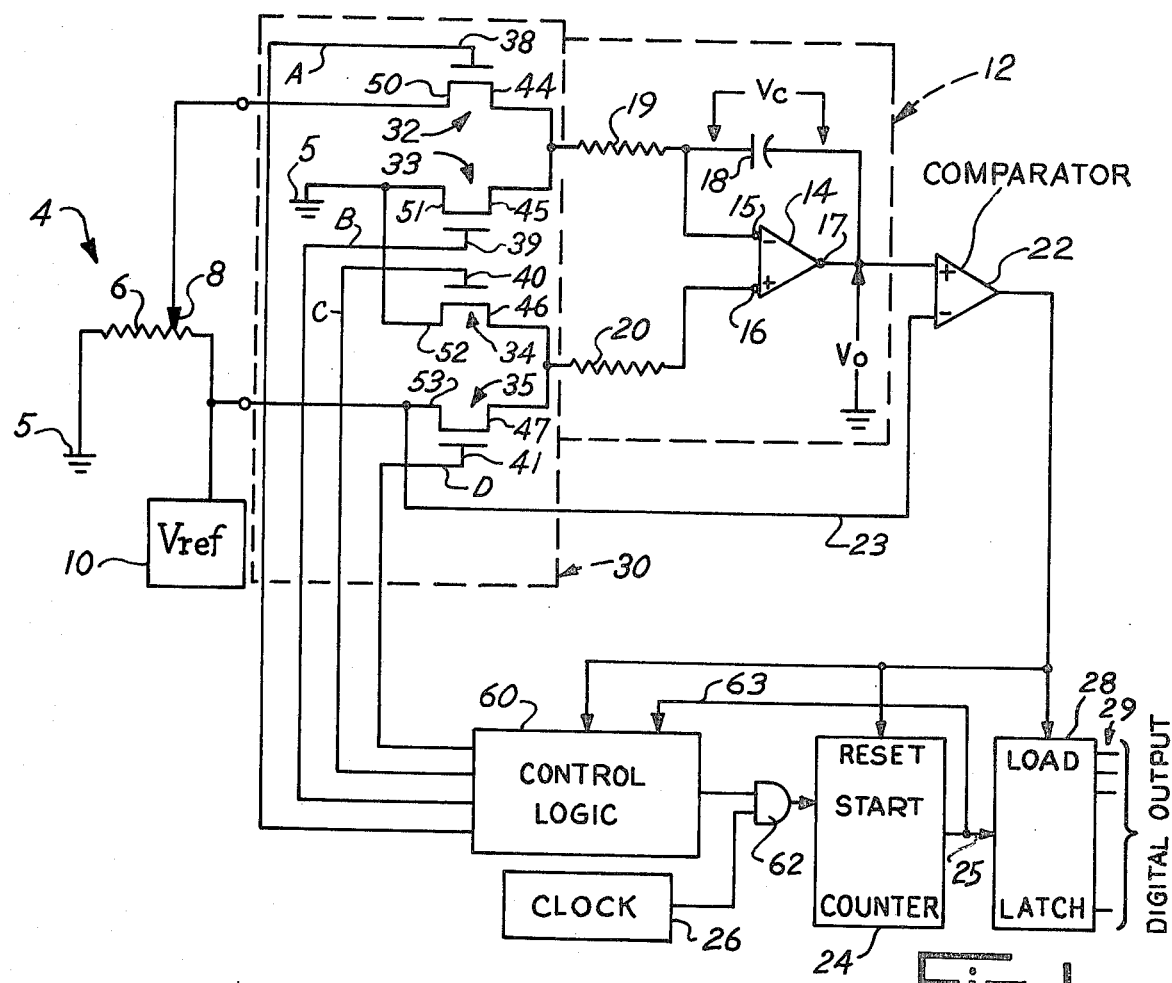
FIG. 1 is a block diagram electrical schematic drawing showing a preferred form of the present invention.

Referring to the drawings, a preferred form of the present invention comprises a source of DC analog voltage 4 which may be a potentiometer 6 that is connected between a source of voltage 10 and a current sink 5 at ground potential. Source 10 produces a reference voltage which is the difference in potential between the voltage produced by source 10 and the voltage established by current sink 5. Any desired DC analog voltage between the value of the reference voltage and ground potential may be selected by moving a slider 8 along potentiometer 6. According to this arrangement, the reference voltage and analog voltage have the same polarity, and current sink 5 has a neutral polarity and voltage.

An integrating circuit 12 comprises a conventional operational amplifier 14 having an inverting input 15, a non-inverting input 16, and an output terminal 17 which produces an output signal Vo. The integrating circuit also comprises a feedback capacitor 18 and input resistors 19 and 20. A conventional comparator 22 compares output signal Vo with a signal transmitted over a conductor 23. When the voltage of the signals becomes identical, the comparator produces an indicating pulse which stops the operation of a digital counter 24. Counter 24 produces a digital output signal on an output cable 25 comprising a plurality of conductors in which each conductor represents one bit of a digital number. The counter sums clock pulses generated by a clock 26 in a well known manner. The output of counter 24 is transmitted to a latch circuit 28 which is loaded in response to the indicating pulse produced by comparator 22. The latch is capable of storing a digital number which is available on digital output terminals 29.

The connection of the reference voltage, analog voltage and current sink to integrating circuit 12 is controlled by a switch circuit 30. The switch circuit comprises MOS field effect transistors 32–35 having gates 38–41, drains 44–47 and sources 50–53, respectively.

Referring to FIG. 3A, source 10 more specifically comprises an operational amplifier 70, a zener diode 72 and resistors 74, 75 and 77 connected as shown. Conductor 79 is connected to a source of positive voltage.

Referring to FIG. 3B, counter 24 more specifically comprises identical counter modules 81 and 82, such as type SN74193 manufactured by Texas Instruments, Inc., and identical counter modules 84 and 85, such as type SN7493 manufactured by Texas Instruments, Inc. Counter 24 also comprises a NAND gate 86, an inverter 88, and conductors 90–93 connected as shown. AND gate 62 (FIG. 1) is fabricated within counter module 81.

Still referring to FIG. 3B, latch 28 more specifically comprises D-type flipflops 96–103, diodes 106–113 and resistors 116–123, respectively. The latch also includes a conductor 125 connector to a source of positive 5 volts potential and a conductor 126 connected to the clock (CLK) inputs of flipflops 96–103.

Referring to FIG. 3A, control logic circuit 60 more specifically comprises D-type flipflops 130–135 having clear inputs (CLR), clock inputs (CLK), D inputs (D), a preset input (PRE), Q outputs (Q) and $\bar{Q}$ outputs ($\bar{Q}$). The logic circuit also comprises AND gates 138–141 used for signal level shifting, NAND gates 142–144, inverters 146–148, 150–151, and a resistor 153. Flipflops 132, 133, 134 and 135 have their D inputs connected to a logical 1 voltage level.

A bipolar transistor 155 is used as a zener diode to provide a nonprecision negative voltage to comparator 22. Operational amplifier 14 and comparator 22 are each supplied with nonprecision sources of positive and negative voltage as shown in FIG. 3A. A resistor 157 is used to protect comparator 22 from start-up transients. The voltage drop across resistor 157 is negligible during normal operation.

Figure 2:
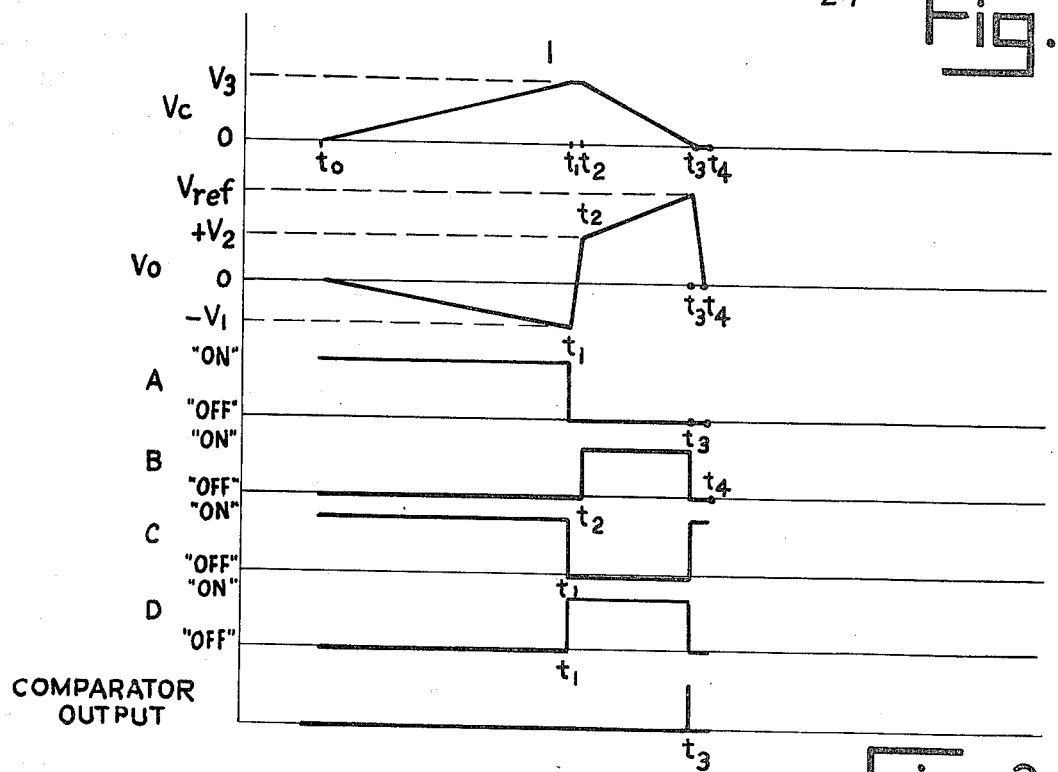
FIG. 2 illustrates voltage waveforms produced at the like-lettered portions of the circuit shown in FIG. 1.

The circuitry operates in the following manner. Referring to FIG. 2, at the beginning of a cycle of operation, such as time $t_o$, capacitor 18 has no charge stored on it, and the gates of transistors 32–35 are biased in the manner shown by the waveforms A–D in FIG. 2. When the gate of a transistor is biased on, the transistor is switched into its saturated condition so that current is readily conducted from the drain to the source. When the transistor is biased in its off condition, the drain-to-source junction presents a relatively high resistance to the flow of electrical current. As a result, at time $t_o$ transistor 32 is switched on or acts as a switch which connects the analog voltage to inverting input 15 and transistor 34 is switched on or acts as a switch which connects ground potential to non-inverting input 16. (The small voltage drop across resistors 19 and 20 will be ignored for purposes of the present explanation.)

At time $t_o$, counter 24 is reset and gate 62 is enabled so that clock pulses are transmitted from clock 26 to counter 24. As the counter advances, capacitor 18 charges in the manner shown by waveform $V_c$ until the counter overflows at time $t_1$.

The output of counter 24 is transmitted to control logic circuit 60 over cable 63. At time $t_1$, the overflow condition of the counter is detected by control logic circuit 60 and the operation of switch circuit 30 is altered. Transistor 32 is switched off and transistor 35 is switched on so that non-inverting input 16 is connected to the reference potential. This mode of operation causes the output signal $V_o$ of the integrating circuit to shift positively or slew by the magnitude of the reference voltage Vref. The change in voltage and polarity of the output signal is illustrated by waveform $V_o$, FIG. 2, in which the difference in voltages V1 and V2 equals Vref.

Once integrating circuit 12 has slewed to its new output level by time t2, as determined by counter 24, transistor 33 is switched on so that inverting input 15 is connected to ground potential. Since integrating circuit 12 responds to differences in input signals, this condition causes the voltage $V_c$ across capacitor 18 to decrease in a linear manner and the output signal $V_o$ to increase in linear manner. At time t2, clock pulses are again allowed to flow into counter 24 which had previously overflowed so that pulses are again counted. Alternatively, the counter may be reset at time t2 so that it is in the same condition as time $t_o$.

The output signal voltage continues to increase until the reference voltage Vref is reached. At this point in time (i.e., time t3), comparator 22 produces a change in output state which loads the number in counter 24 into latch circuit 28, resets counter 24, and causes control logic circuit 60 to switch the transistors in switching circuit 30 in the manner shown by waveforms A–D in FIG. 2. More specifically, transistors 33 and 35 are switched off and transistor 34 is switched on so that inverting input 15 floats and non-inverting input 16 is connected to ground potential. Output signal $V_o$ then slews back to ground potential at time t4 so that the circuit is ready for another cycle of operation. This slewing of output signal $V_o$ also causes the output of comparator 22 to revert to its original state.

Since capacitor 18 is allowed to float while the integrating circuit is slewing, the charge stored on the capacitor changes by only a negligible amount during the slew period. This mode of operation is shown by waveform $V_c$ in FIG. 2 between time periods t1 and t2. As a result of this operation, the reference voltage and DC analog voltage may have the same polarity, thereby drastically simplifying the design and complexity of the power supply which furnishes the voltage needed to operate the circuitry.

Voltage waveforms $V_c$ and $V_o$ are somewhat idealized in FIG. 2 in order to clarify the explanation of operation. The actual voltages may be offset slightly from the values shown due to the internal biasing voltages of operational amplifier 14.

Those skilled in the art will recognize that only a preferred embodiment of the invention is shown herein and that the embodiment may be altered and modified without departing from the spirit and scope of the invention as defined in the appended claims.

What is claimed is:

1. A system for converting the magnitude of a DC voltage having predetermined polarity into a plurality of signals representing a corresponding digital number comprising:
  an input terminal for receiving the DC voltage;
  a current sink having neutral polarity and neutral voltage;
  a source of a reference voltage having the predetermined polarity;
  an integrating circuit having an inverting input, a non-inverting input, and an output for producing an output signal;
  comparator means for producing an indicating signal in response to a predetermined relationship between the output signal and the reference voltage;
  a digital counter resettable in response to the indicating signal;
  clock means for generating clock pulses;
  first switch means for operatively connecting the DC voltage to the inverting input during a first operating state, for operatively connecting the current sink to the inverting input during a second operating state and for disconnecting the DC voltage and the current sink from the inverting input during a third operating state;

second switch means for operatively connecting the non-inverting input to the current sink during a first operating state and for operatively connecting the reference voltage to the non-inverting input during a second operating state; and control means operable in the first mode for simultaneously operating the first and the second switch means in their first operating states and for transmitting clock pulses to the counter until the counter achieves a predetermined count so that the output signal attains a first voltage, operable in a second mode in response to the predetermined count for simultaneously operating the first switch means in its third operating state and the second switch means in its second operating state so that the output signal attains a second voltage different from the first voltage by a value proportional to the reference voltage, operable in a third mode for simultaneously operating the first and second switch means in their second operating states and for transmitting clock pulses to the counter until an indicating signal is produced so that the count registered in the counter is proportional to the magnitude of the DC voltage, and operable in a fourth mode for resetting the counter, operating the first switch means in its third operating state and operating the second switch means in its first operating state so that the output signal returns toward the neutral voltage.

2. Apparatus, as claimed in claim 1, wherein the integrating circuit comprises an operational amplifier and a capacitive feedback network connected between the output and the inverting input.

3. Apparatus, as claimed in claim 1, wherein the DC voltage is derived from a potentiometer connected to the reference voltage source.

4. Apparatus, as claimed in claim 1, wherein the first and second switch means each comprise semiconductor switching devices.

5. Apparatus, as claimed in claim 1, wherein the first voltage of the output signal has one polarity with respect to the neutral voltage and the second voltage of the output signal has an opposite polarity with respect to the neutral voltage.

6. Apparatus, as claimed in claim 1, wherein the control means comprises means for resetting the counter in response to the predetermined count.

* * * * *